United States Patent
Parkhe et al.

(10) Patent No.: US 7,589,950 B2
(45) Date of Patent: Sep. 15, 2009

(54) DETACHABLE ELECTROSTATIC CHUCK HAVING SEALING ASSEMBLY

(75) Inventors: Vijay D. Parkhe, San Jose, CA (US); Cheng-Tsiung Tsai, Cupertino, CA (US); Steven V. Sansoni, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 425 days.

(21) Appl. No.: 11/549,594

(22) Filed: Oct. 13, 2006

(65) Prior Publication Data

US 2008/0089001 A1    Apr. 17, 2008

(51) Int. Cl.
*H01L 21/683* (2006.01)
*B23B 31/28* (2006.01)

(52) U.S. Cl. .................................. 361/234; 279/128
(58) Field of Classification Search ............ 361/234; 279/128
See application file for complete search history.

(56) References Cited

U.S. PATENT DOCUMENTS

| | | |
|---|---|---|
| 3,586,343 A | 6/1971 | Reed |
| 4,180,723 A | 12/1979 | Szupillo |
| 4,184,188 A | 1/1980 | Briglia et al. |
| 4,384,918 A | 5/1983 | Abe |
| 4,645,218 A | 2/1987 | Ooshio et al. |
| 4,902,025 A | 2/1990 | Zimdars |
| 5,155,652 A | 10/1992 | Logan et al. |
| 5,191,506 A | 3/1993 | Logan et al. |
| 5,213,349 A | 5/1993 | Elliott |
| 5,280,156 A | 1/1994 | Niori et al. |
| 5,376,213 A | 12/1994 | Ueda et al. |
| 5,460,684 A | 10/1995 | Saeki et al. |
| 5,478,429 A | 12/1995 | Komino et al. |
| 5,527,584 A | 6/1996 | Darfler et al. |
| 5,529,657 A | 6/1996 | Ishii |
| 5,581,874 A | 12/1996 | Aoki et al. |
| 5,600,530 A | 2/1997 | Smith |
| 5,606,484 A | 2/1997 | Kawada et al. |
| 5,625,526 A | 4/1997 | Watanabe et al. |

(Continued)

FOREIGN PATENT DOCUMENTS

EP     0 123 456 A2    10/1984

(Continued)

OTHER PUBLICATIONS

M Cubed Technologies, Inc., "Beams and Structural Members", Beam Note, Rev. 03, Jul. 25, 2001, retrieved at Internet address www.mmmt.com/Beam.pdf.

(Continued)

*Primary Examiner*—Stephen W Jackson
*Assistant Examiner*—Scott Bauer
(74) *Attorney, Agent, or Firm*—Janah & Associates, P.C.

(57) ABSTRACT

A detachable electrostatic chuck is capable of being attached to a pedestal in a process chamber. The chuck comprises an electrostatic puck having a ceramic body with an embedded electrode. The chuck also has a baseplate below the electrostatic puck with a lower surface which is bonded to a sealing assembly comprising a sealing plate and sealing ring. The sealing plate and ring are polished to form a gas-tight seal between the chuck and pedestal to prevent gas leakage from or into this region.

38 Claims, 3 Drawing Sheets

U.S. PATENT DOCUMENTS

| | | | |
|---|---|---|---|
| 5,665,260 A | 9/1997 | Kawada et al. | |
| 5,671,116 A | 9/1997 | Husain | |
| 5,720,818 A | 2/1998 | Donde et al. | |
| 5,729,423 A | 3/1998 | Donde et al. | |
| 5,737,178 A | 4/1998 | Herchen | |
| 5,745,331 A | 4/1998 | Shamouilian et al. | |
| 5,796,074 A | 8/1998 | Edelstein et al. | |
| 5,818,693 A | 10/1998 | Garner et al. | |
| 5,822,171 A | 10/1998 | Shamouilian et al. | |
| 5,827,585 A | 10/1998 | Giannetti | |
| 5,858,100 A | 1/1999 | Maeda et al. | |
| 5,870,100 A | 2/1999 | DeFreitas | |
| 5,879,100 A | 3/1999 | Winkler | |
| 5,886,863 A | 3/1999 | Nagasaki et al. | |
| 5,886,864 A | 3/1999 | Dvorsky | |
| 5,906,684 A | 5/1999 | Tamura et al. | |
| 5,949,650 A | 9/1999 | Bulante et al. | |
| 5,958,813 A | 9/1999 | Aida et al. | |
| 5,978,202 A | 11/1999 | Wadensweiler et al. | |
| 5,986,747 A | 11/1999 | Moran | |
| 5,986,875 A | 11/1999 | Donde et al. | |
| 5,994,662 A | 11/1999 | Murugesh | |
| 6,034,863 A | 3/2000 | Marohl et al. | |
| 6,048,434 A | 4/2000 | Tamura et al. | |
| 6,072,685 A | 6/2000 | Herchen et al. | |
| 6,074,512 A | 6/2000 | Collins et al. | |
| 6,081,414 A | 6/2000 | Flanigan et al. | |
| 6,094,334 A | 7/2000 | Bedi et al. | |
| 6,108,189 A | 8/2000 | Weldon et al. | |
| 6,120,661 A | 9/2000 | Hirano et al. | |
| 6,159,055 A | 12/2000 | Satitpunwaycha et al. | |
| 6,181,049 B1 | 1/2001 | Streckert et al. | |
| 6,215,641 B1 | 4/2001 | Busse et al. | |
| 6,219,219 B1 | 4/2001 | Hausmann et al. | |
| 6,310,755 B1 | 10/2001 | Kholodenko et al. | |
| 6,462,928 B1 | 10/2002 | Shamouilian et al. | |
| 6,490,144 B1 | 12/2002 | Narendrnath et al. | |
| 6,490,146 B2 | 12/2002 | Wang et al. | |
| 6,503,131 B1 | 1/2003 | Franklin et al. | |
| 6,503,572 B1 | 1/2003 | Waggoner et al. | |
| 6,506,291 B2 | 1/2003 | Tsai et al. | |
| 6,538,872 B1 | 3/2003 | Wang et al. | |
| 6,563,686 B2 * | 5/2003 | Tsai et al. | 361/234 |
| 6,646,233 B2 | 11/2003 | Kanno et al. | |
| 6,700,099 B2 | 3/2004 | Cole, Sr. et al. | |
| 6,740,853 B1 | 5/2004 | Johnson et al. | |
| 6,853,533 B2 * | 2/2005 | Parkhe | 361/234 |
| 6,907,924 B2 | 6/2005 | Moslehi | |
| 6,918,530 B2 | 7/2005 | Shinkai et al. | |
| 7,029,529 B2 | 4/2006 | Law et al. | |
| 7,247,819 B2 * | 7/2007 | Goto et al. | 219/444.1 |
| 7,480,129 B2 * | 1/2009 | Brown et al. | 361/234 |
| 2001/0012604 A1 * | 8/2001 | Okase et al. | 432/86 |
| 2002/0036881 A1 | 3/2002 | Shamouilian et al. | |
| 2002/0050246 A1 | 5/2002 | Parkhe et al. | |
| 2002/0075624 A1 | 6/2002 | Wang et al. | |
| 2002/0081445 A1 | 6/2002 | Kadomura et al. | |
| 2003/0168439 A1 * | 9/2003 | Kanno et al. | 219/390 |
| 2005/0219786 A1 * | 10/2005 | Brown et al. | 361/234 |

FOREIGN PATENT DOCUMENTS

| | | |
|---|---|---|
| EP | 0 790 641 A | 8/1997 |
| JP | 04-238882 | 8/1992 |
| JP | 09-045757 A | 2/1997 |
| JP | 10-270540 A | 10/1998 |
| JP | 11-163109 A | 6/1999 |
| JP | 11-176919 A | 7/1999 |
| WO | WO-2008/048518 | 4/2008 |

OTHER PUBLICATIONS

M Cubed Technologies, Inc., "Si Wafer Chucks", retrieved at Internet address www.mmmt.com/chuck.pdf.

M Cubed Technologies, Inc., "Overview of M Cubed Technologies' Materials Processes", Materials Overview, Rev. 02, 080403, retrieved at Internet address www.mmmt.com/Technotes/MaterialsOverview.pdf.

M Cubed Technologies, Inc., "Preform Infiltrated Silicon Carbide Particulate- Reinforced Aluminum (AlSiC) Metal Matrix Composites", Infiltrated MMC, Rev. 01, Nov. 2, 1999, retrived at Internet address www.mmmtcom/Technotes/InfilMMCNote.pdf.

M Cubed Technologies, Inc., "Cast Silicon Carbide Particulate-Reinforced Aluminum (Al/SiC) Metal Matrix Composites", Cast MMC, Rev. 02, May 08, 2001, retrieved at Internet address www.mmmt.com/Technotes/CastMMCNote.pdf.

M Cubed Technologies, Inc., "Reaction Bonded Silicon Carbide Ceramics", Reaction Bonded SiC, Rev. 02, Nov. 18, 1999, retrieved at Internet address www.mmmt.com/Technotes/SiCNote.pdf.

M Cubed Technologies, Inc., "Aluminum-Toughened SiC Ceramic", Al-Toughened SiC, Rev. 05, Aug. 4, 2003, retrieved at Internet address www.mmmt.com/Technotes/ToughenedSiCNote.pdf.

Karandikar et al., "Complex, net-shape ceramic composite components for structural, lithography, mirror and armor applications", Presented at the 27th Annual Cocoa Beach Conference and Exposition, Cocoa Beach, FL, 2003 by M Cubed Technologies, Inc., retrieved at Internet address www.mmmt.com/Publications/MCubedCocoaBeach03.pdf.

IBM Technical Disclosure Bulletin, vol. 31, No. 1, Jun. 1988, pp. 462-464.

* cited by examiner

DETACHABLE ELECTROSTATIC CHUCK HAVING SEALING ASSEMBLY

BACKGROUND

Embodiments of the present invention relate to an electrostatic chuck for holding a substrate in a process chamber and related methods of manufacture.

In the processing of substrates, such as semiconductor wafers and displays, the substrate is placed on a support in a process chamber and suitable processing conditions are maintained in the chamber. In a typical process, energized gases are used to process the substrate by, for example, etching or depositing material on the substrate, or perform other tasks such as clean surfaces in the chamber. During processing, a process gas is introduced into the chamber and the chamber is typically maintained at low pressure or even vacuum conditions. The process gas is energized by coupling RF or microwave energy to the gas. The energized process gas can comprise highly corrosive species, such as chemical etchants, as well as energized ionic and radical species. Also, the energized gas, which may be a plasma is often at elevated temperatures.

The support used in the chamber can include an electrostatic puck that has an electrode capable of being electrically biased to hold the substrate on the support. Electrostatic pucks made of ceramics provide good resistance to corrosion by energized process gases and can maintain their structural integrity even at high substrate processing temperatures exceeding several hundred degrees centigrade. The electrode in the electrostatic puck may also be electrically biased, for example with an RF bias power, to energize a process gas in the chamber to process the substrate. The support also comprises a pedestal that supports the electrostatic puck in the chamber, and may be capable of raising or lowering the height of the electrostatic puck and substrate. The pedestal can also provide a protective enclosure for connecting wires, gas tubes, and other structures that are connected to the support. The pedestal is typically made from a metal to allow easier fabrication of the connections ports and structures in the pedestal. The interface between the electrostatic puck and the pedestal can include a heat exchanger plate which is maintained at a higher gas pressure than the chamber environment.

The electrostatic puck is bonded to a composite baseplate comprising a metal infiltrated porous ceramic material. The composite base plate allows mechanical fastening of the electrostatic puck to the pedestal via holes about a peripheral ledge of the baseplate. The electrostatic chuck is attached to the composite baseplate to form a detachable structure which can be easily removed from the pedestal for cleaning or replacement. The baseplate also has a good thermal conductivity to provide efficient removal of heat generated by the plasma. Also, the baseplate provides full area temperature control as steps up from the larger area of the pedestal to the smaller area of the electrostatic puck.

However, it is difficult to form a reliable gas-tight seal at the interface between the detachment electro static chuck and the pedestal because of preprocess variability in the lower surface of composite baseplate. The metal infiltrated structure has variability in its surface roughness arising from the variability in pore filling, porosity, or metal coating of this surface. A good gas tight seal is needed because the interface of the heat exchanger plate is at higher gas pressures than the chamber. This interface is provided with air or nitrogen for good heat transfer and it is undesirable for these gases to escape from this region and into the surrounding vacuum of the chamber. The composite baseplate which forms the lower surface of the electrostatic chuck comprises a composite ceramic and metal material having a somewhat random porosity which results in a roughened surface that does not provide an adequate gas-tight seal the even with surrounding o-rings. Further, applying an excessively high torque to the fasteners to clamp down the electrostatic chuck assembly to the pedestal to maintain an acceptable vacuum seal at the interface can cause the ceramic structure of the baseplate to micro-crack and also cause the vacuum seal provided by the o-rings to gradually deteriorate with heating and cooling cycles.

Thus, it is desirable to have a system which provides a good gas tight seal between the electrostatic chuck and the pedestal. It is also desirable to have good and uniform heat transfer rates between the chuck assembly and pedestal.

DRAWINGS

These features, aspects, and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

FIG. 5 is a schematic sectional side view of an embodiment of a chamber having a support comprising an electrostatic chuck and pedestal with sealing plates in between.

DESCRIPTION

Figure 1:
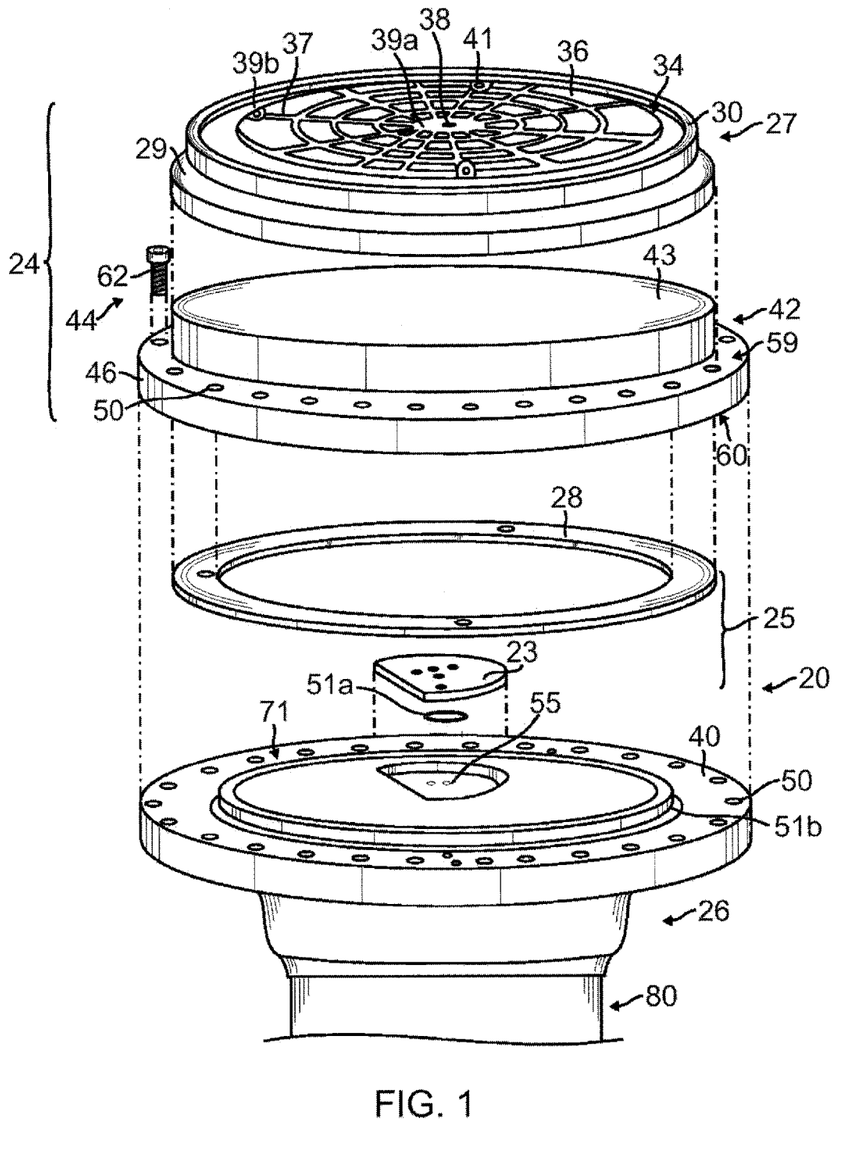
FIG. 1 is an exploded view of an embodiment of an electrostatic chuck and pedestal showing a sealing assembly therebetween.
Figure 2:
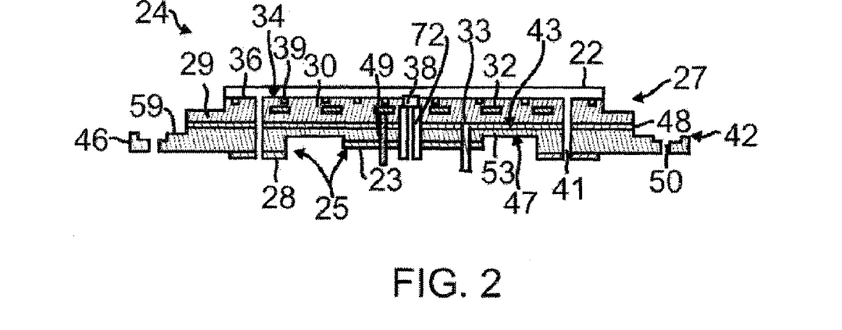
FIG. 2 is a schematic sectional side view of the assembled electrostatic chuck and sealing assembly.

A substrate support 20 capable of holding a substrate 22 comprises an electrostatic chuck 24, a sealing assembly 25, and a pedestal 26, as shown in FIGS. 1 and 2. While an exemplary sealing assembly 25 comprising a sealing plate 23 and a sealing ring 28 is illustrated in the context of exemplary embodiments of an electrostatic chuck 24 and pedestal 26, it should be understood that the sealing assembly 25 can have other components, shapes and sizes as would be apparent to those of ordinary skill in the art. The sealing assembly 25 can also be used with other versions of electrostatic chucks, or even vacuum and mechanical chucks, and other versions of pedestals. Thus, the invention should not be limited to the exemplary versions of electrostatic chucks and pedestals described here.

The electrostatic chuck 24 comprises an electrostatic puck 27 having a disc-like shape that matches the shape and size of the substrate 22 held on the chuck, and with an outwardly extending annular flange 29. The puck 27 comprises a dielectric 30 that at least partially covers a chargeable electrode 32, as shown in FIG. 2, which can be embedded in, or covered by, the dielectric 30. The dielectric 30 desirably comprises a material permeable to electromagnetic energy, such as for example, at least one of aluminum nitride, aluminum oxide, and titanium oxide, and preferably comprises aluminum nitride. The dielectric 30 can, however, also comprise other layers such as polymer layers, for example, polyimide.

Figure 5:
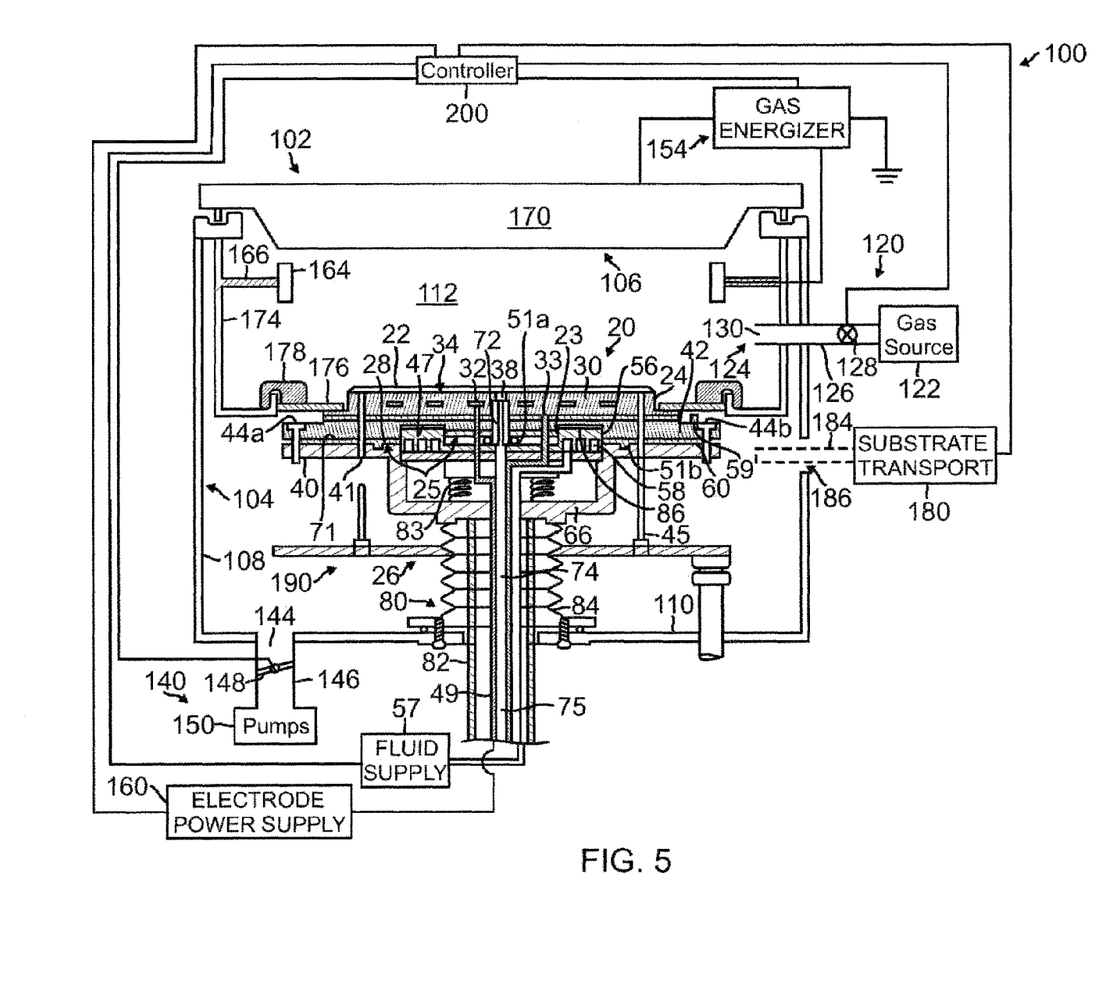

Typically the electrode 32 embedded in the dielectric 30 of the puck 27 comprises a metal layer. The electrode metal can be stainless steel, aluminum, copper or even high temperature metals such as molybdenum or tungsten. In the version shown in FIG. 2, the ceramic body of the electrostatic puck 27 comprises aluminum nitride with an embedded electrode 32 comprising a wire grid or plate of molybdenum. The electrode 32 is capable of being electrically biased to electrostatically hold the substrate 22 on the receiving surface 34 of the chuck. For example, the electrode 32 can be connected via one or more electrical connectors 84, as shown in FIG. 5, to an electrode power supply 160 that delivers a bipolar DC voltage. The bipolar electrode 32 has two sides that are each maintained at a different voltage to generate an electrostatic charge in the substrate 22 which clamps it to the chuck.

The electrostatic puck 27 further comprises a substrate receiving surface 34 that serves to receive a substrate 22 on the electrostatic chuck 24. In the version shown in FIG. 1, the receiving surface 34 comprises a plurality of raised wedge shaped mesas 36 which are formed by intersecting gas grooves 37. The gas grooves 37 are provided to hold a heat transfer gas such as helium or argon, which is supplied through the gas port 38 on the receiving surface 34. In the version shown, the gas grooves 37 are radial lines that are spread apart from one another by from about 5 to about 10°, and terminate in an inner circular groove 39a and an outer circular groove 39b. While an exemplary embodiment of the substrate receiving surface 34 of the electrostatic puck 27 is illustrated herein, it should be understood that other versions can also be used, and the present invention should not be limited to the exemplary version illustrated herein.

The electrostatic chuck 24 further comprises a baseplate 42 joined to the electrostatic puck 27 that is used to attach the electrostatic puck 27 to a pedestal 26 in the chamber. The baseplate 42 comprises a top surface 43 underneath the puck 27, and an peripheral ledge 46 that extends outwardly beyond the top surface 43. The peripheral ledge 46 extends beyond the annular flange 29 of the puck 27 to provide an exposed baseplate portion that is uncovered by the dielectric 30, and that can be attached to an underlying pedestal 26 in a chamber.

In one version, the baseplate 42 comprises a material having thermal properties that are suitably matched to the overlying dielectric 30 of the electrostatic puck 27. For example, the baseplate 42 can comprise a composite base of ceramic and metal, which provides better strength and durability than ceramic alone and also has good heat transfer properties. The composite base has a thermal expansion coefficient that is matched to the dielectric 30 to reduce thermal expansion mismatch. In one version, the composite base comprises a ceramic having pores that are infiltrated with a metal, which at least partially fills the pores to form a composite material. The ceramic may comprise, for example, at least one of silicon carbide, aluminum nitride, aluminum oxide or cordierite, and is preferably silicon carbide. The ceramic may comprise a pore volume of from about 20 to about 80 volume % of the total volume, the remainder volume being of the infiltrated metal. In another version, the composite baseplate 42 may comprise a different composition of a ceramic and metal, such as metal having dispersed ceramic particles; or the baseplate 42 can be made from only a metal, such as stainless steel or aluminum. The infiltrated metal can comprise aluminum with added silicon and copper. In one version, the baseplate 42 comprises a composite base comprising consisting of ceramic and metal, such as silicon carbide infiltrated with a metal alloy comprising aluminum, silicon and trace amounts of copper.

The electrostatic chuck 24 is formed by joining the electrostatic puck 27 to the surface 43 of the baseplate 42. In one version, the infiltrated metal used to infiltrate the pores of the baseplate 43 can also be used to bond the electrostatic puck 27 to the baseplate 42 by a bond layer 48, as shown in FIG. 2. In another version, the electrostatic puck 27 is attached to the baseplate 42 by a bond layer 48 made from a metal foil, such as an aluminum foil, which diffusion bonds the baseplate 42 and dielectric 30. The electrostatic chuck 24 is detachable and can be easily removed from the pedestal 26 when replacement or refurbishment of one or more of the electrostatic puck 27 or its underlying baseplate 42 is required.

Figure 3:
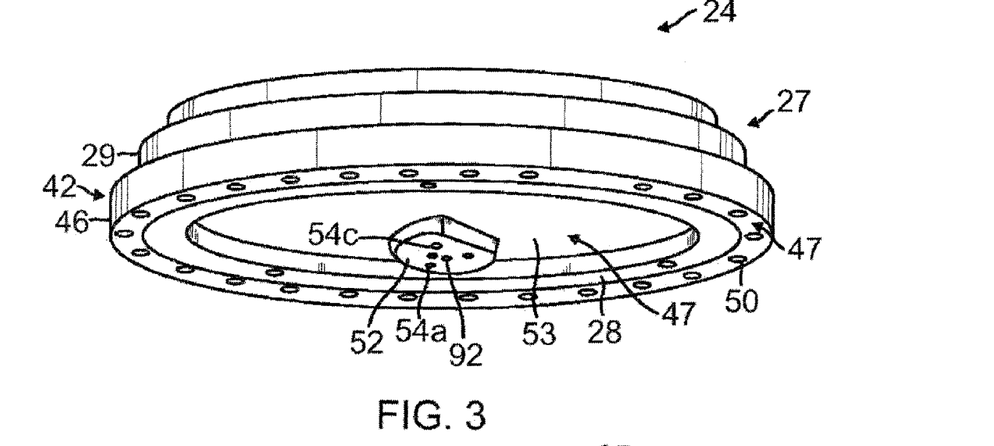
FIG. 3 is a perspective view of the electrostatic chuck of FIG. 1 showing the bottom surface of the chuck.

The backside surface 47 of the baseplate 42 of the electrostatic chuck 24 comprises a raised central protrusion 52, which is surrounded by an annular trough 53, as for example shown in FIG. 3. The raised central protrusion 52 is D-shaped, having a contour that is formed by a semicircular perimeter with ends joined by a flat edge. In the version shown, the semicircular contour comprises a three-quarter circle, but it may also be a half-circle or other asymmetric shapes. The protrusion 52 is shaped and sized to match a corresponding cavity 55 in the pedestal 26, as shown in FIG. 1. In this version, the cavity 55 is also D-shaped to mate with the D-shaped protrusion 52 to form an alignment key. This allows the protrusion 52 and cavity 55 to serve as an alignment key when the chuck 24 is positioned on the pedestal 26 in the chamber. The alignment key reduces the possibility of damaging the chuck 24 by improperly positioning or locating the chuck 24 on the underlying pedestal 26 when moving or replacing the chuck 24 from the chamber in the fabrication lab.

In addition, the raised central portion also has three apertures 54a-c, which are spaced apart from one another The apertures 54 receive the electrode terminal posts 49 which are mounted in the cavity 55 of the pedestal 26. The apertures 54a-c also served as a secondary alignment guide further ensuring the placement accuracy of positioning the chuck 24 onto the pedestal 26. The asymmetrically offset apertures 54a-c ensure that the chuck 24 can only be positioned in one orientation over the pedestal 26. In one version, the offset angle a is from about 115 to about 135°, for example about 125°. Two of the apertures 54a,b are used to connect to electrode posts 49 that supply a voltage bias to the bipolar electrodes 32 to maintain an electrostatic charge in the electrodes. The third aperture 54c connects to another post (not shown) which contacts the chuck 24 to a floating potential that is used to adjust voltage applied through the post 49.

In addition, the protrusion 52 has a centrally positioned gas coupler 74 to receive a gas tube 72 that extends out of the cavity 55. The gas tube 72 provides a heat transfer gas, such as argon or helium, to the gas port 38, which in turn supplies the gas grooves 37, 39a,b to maintain a supply of heat transfer gas below the substrate 22 during processing. The heat transfer gas assists in exchanging heat between the overlying substrate 22 and chuck 24 as shown in FIG. 5. Yet another hole 92 is provided to allow insertion of a thermocouple 33, typically a k-type thermocouple 33, to contact the puck 27.

Figure 4:
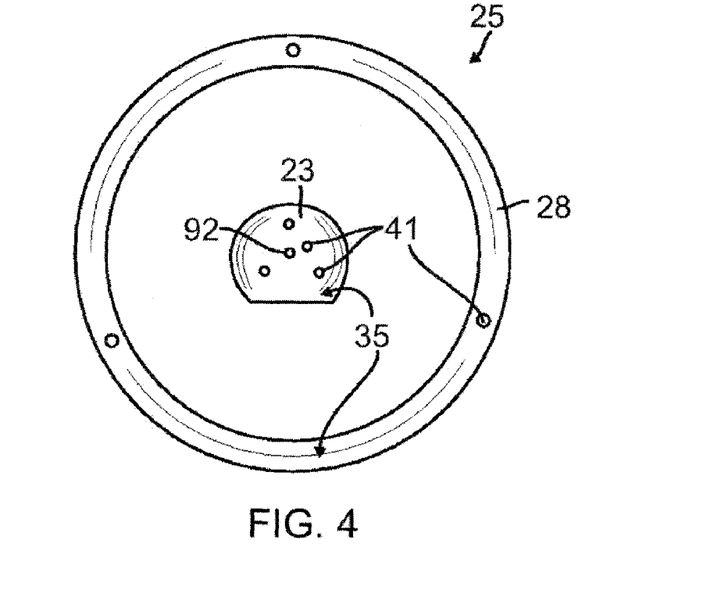
FIG. 4 is plan view of the bottom of a sealing assembly plate comprising a sealing plate and a sealing ring.

The sealing assembly 25 comprises a sealing plate 23 and a sealing ring 28 concentric to the sealing plate 23, as shown in FIG. 4. The sealing assembly 25 is bonded to the backside surface 47 of the baseplate 42 to provide a seal around the heat transfer gas connections from the vacuum environment in the chamber. The sealing plate 23 and peripheral sealing ring 28 cooperate with a set of O-rings 51a, 51b situated on the upper surface 71 of the pedestal 26 to provide a sealing circumference. The chuck 24 is fastened to the ledge 40 of the support pedestal 26 and a tight seal is formed between the electrostatic chuck 24 and the pedestal 26 by tightening connectors 44a,b inserted in holes 50 along the edge of the peripheral ledge 46 of the baseplate. When the connectors 44a,b comprise a set of 24 threaded screws, and the interface is constructed in this novel manner, the torque on each screw which is necessary to form an acceptable vacuum seal has been observed to decrease from 90 lbf-in to 50 lbf-in, as compared to interfaces constructed without the sealing plate 23 and sealing ring 28.

The sealing plate 23 attached to the raised protrusion 52 of the backside surface 47 of the baseplate 42. In one version, the sealing plate 23 is formed from a circular disk plate having a thickness of less than about 4 mm, or even from about 0.2 mm and about 2 mm, and radius of from about 2 to about 6 cm. In the version shown, the sealing plate 23 is D-shaped having a contour that is a semicircle with ends joined by a flat edge, and corresponding to the backside surface's raised protrusion 52 on which it is attached. The semicircular contour comprises a three-quarter circle, but it may also be a half-circle or other asymmetric shapes. The sealing plate 23 is also shaped and sized to match a corresponding cavity 55 in the upper surface 71 of the pedestal 26. The flat edge of the D-shape of the sealing plate 23 serves as an alignment key that mates with a corresponding flat edged cavity 55 in the pedestal. In the version shown, five apertures 54 are punched in the sealing plate 23 so that the plate encircles and allows for the passage of the gas coupler 74, the thermocouple 33, and three electrode posts 49 as shown in FIG. 5. The apertures 54 are aligned to correspond with those fabricated on the D-shaped protrusion 52 of the baseplate 42.

In one version, the sealing ring 28 is a circular ring which is sized to be about the peripheral portion the electrostatic chuck 24 to serve as a peripheral ring. The sealing ring 28 is sized larger than the sealing plate 23 so that it surrounds the plate 23 and is arranged concentric to the plate 23. For example, in one version, the circular ring comprises an inner radius of at least about 10 cm and an outer radius of less than about 18 cm. The sealing ring 28 can also have other shapes, such as a rectangular ring, for example, for chambers used in flat panel processing. The sealing ring 28 also can have a thickness of less than about 4 mm, or even a thickness of from about 0.2 mm to about 2 mm.

In one version, the sealing plate 23 and sealing ring 28 are polished over a portion of their surface to obtain a surface flatness of less than about 200 microns, or even from about 25 microns to about 125 microns, to ensure the desired level of vacuum sealing. By surface flatness, it is meant that the local irregularities in the surface have a maximum peak-to-trough separation of less than the specified length. A surface with a surface flatness of less than about 200 microns would comprise a surface having local irregularities having a maximum peak-to-trough separation of less than about 200 microns. The surface flatness can be measured by dragging a stylus across the surface and measuring it's deflection with a laser interferometer. Specifically, these smooth regions include the areas of the surface which interact with the O-ring 51a seated on the pedestal 26 around the gas coupler 74, and with the O-ring 51b seated in O-ring groove in the pedestal flange 40 outside of the annular trough 53.

The surfaces of the sealing assembly 25 may be polished by rubbing the surface with polishing pad in a circular motion while applying a polishing slurry to the rubbing surfaces. Conventional polishing techniques can be used, such as dry or wet sanding, with successively finer grades (mesh sizes) of polishing powder. For example, a suitable sequence of polishing slurries can be a mesh size of 125, a mesh size of 225, and a mesh size of 325 or smaller. The sealing plates 23, 28 should be polished to achieve a seal such that a conventional helium leak test result will provide a helium leak rate of less than $10^{-9}$ millibar liter/second. In one version the sealing surface of the sealing assembly 25 is machine finished with a concentric machining profile. If the surface is finished to a surface roughness of about 32 RA by machining, then it is not necessary to polish the surface.

The sealing assembly 25 comprising sealing plate 23 and sealing ring 28 may be formed by stamping or machining a D-shape and circular ring of the desired dimensions from a metal or ceramic. The metal can be nickel, molybdenum, stainless steel, titanium, zirconium, or alloys thereof, and the ceramic can be aluminum nitride. One version uses a sealing plate 23 and sealing ring 28 comprising molybdenum to withstand elevated temperatures and the environment in the chamber. However, the sealing plate 23 and ring 28 can also be made from other materials as would be apparent to one of skill in the art. In one version, the sheet can have a thickness of less than about 4 mm in order to obtain a sealing plate 23 and ring 28 having thickness of less than about 4 mm.

The polished sealing ring 28 is attached onto the backside surface 47 of the baseplate 42 to provide a smooth sealing surface for pressing against an O-ring 51b. The sealing ring 28 has a vertical thickness of less than about 4 mm, and even from about 0.2 mm and 2 mm. The inner and outer radius can be determined by the dimensions of the substrate receiving surface 34, whereby the inner edge of the ring rests approximately flush with the innermost ledge of the bottom surface of the baseplate 42, and the outermost edge lies beneath and approximately flush with the outermost edge of the substrate receiving surface 34. Thus the inner radius is typically at least about 10 cm and the outer radius is typically less than about 18 cm. The polished sealing ring 28 includes holes 41 which are aligned to allow passage of substrate lifting pins 45.

In one version, which facilitates assembly of the electrostatic chuck 24 to the sealing assembly 25, the sealing plate 23 and sealing ring 28 are bonded to the baseplate 42 by metal infiltration, brazing, soldering or diffusion bonding. A hot press or hot isostatic press can also be used to apply pressure on the assembly during bonding to remove air pockets and create a good interface with uniform thermal impedance. Metal materials used for bonding can be aluminum based or copper-silver based or other materials under 1000° C., or even under 600° C., or even lower temperature solder. The bond may also be formed by polymer glue or other low temperature glue method (compared to brazing or bonding temperature of AlN—AlSiC), such as indium.

The sealing assembly 25 can be bonded to the baseplate 42 using the same process as that used to infiltrate metal into the porous structure of the baseplate 42. In this version, the sealing assembly 25 is held to the baseplate 42 while molten metal is seeped into the fine gap between the top surface 35 of the sealing assembly 25 and the backside surface 47 of the baseplate 42. The entire structure can be held in a mold and a pressure may also be applied during this process to form a superior bond. Advantageously, the electrostatic chuck 24 can also be simultaneously bonded to the baseplate 42 simply by holding the electrostatic chuck 24 in contact with the top surface 43 of the baseplate 42 while the sealing assembly 25 contacts the backside surface 47 of the baseplate 42. A suitable infiltration metal comprises an alloy of aluminum with added silicon and copper.

In another joining method, the sealing plate 23 and ring 28 are bonded to the baseplate 42 by applying a brazing compound to at least one of the joining surfaces of the sealing assembly 25, and they are aligned so that their feedthroughs 54 and holes 41 form continuous passages. Brazing compound is applied to either the backside 47 of the baseplate 42 or the top surfaces 35 of the sealing plate 23 and ring 28. Suitable brazing compounds should have a fluxing temperature lower than the melting point of both the baseplate 42 and the sealing plate 23 and ring 28. For example, when the baseplate 42 is fabricated from ceramic and the sealing plates 25 from stainless steel, the brazing compound is selected to have a fluxing temperature which is less than the melting temperature of stainless steel, for example, by at least about 200° C. In fabrication, a slurry of brazing compound or a thin sheet of brazing foil can be applied between the sealing assembly 25 and the baseplate 42. The brazing compound typically comprises an alloy comprising at least one of aluminum, copper, indium, lead, magnesium, nickel, tin, silicon and their alloys thereof. For example, a suitable brazing compound comprises Cusin-1-ABA™, a brazing alloy paste which contains mostly silver and copper, and available from WESGO Inc., Belmont, Calif., which melts at 775° C. A suitable brazing foil comprises MBF-20 brazing foil, MET-GLAS™, which is a nickel based brazing foil containing boron, iron, silicon, chromium and cobalt, and which has a melting point of about 1000° C.

The sealing assembly 25 after being coated with brazing compound or having the brazing foil therebetween, are then aligned to the backside 47 of the baseplate 42 to form the assembly such that the apertures 54 and holes 41 form continuous passages. The assembly is then heated to allow the brazing compound to soften and react with the sealing plate 23 and ring 28 and the baseplate 42 to form a brazed bond. The sealing assembly 25 and baseplate 42 can be heated in a brazing oven or hot press while applying a suitable pressure to the assembly. The assembly is heated to a temperature sufficiently high to cause the brazing compound to flux and join the assembly 25 to the baseplate 42. Thereafter, the brazed assembly is cooled to room temperature. Suitable brazing methods and materials are described in for example, commonly assigned U.S. Pat. No. 6,503,368 to Kholendenko et al., filed on Jun. 29, 2000; U.S. Pat. No. 6,583,980 to Wang et al., filed on Aug. 18, 2000; U.S. Pat. No. 6,490,146 to Wang et al., filed on Aug. 13, 2001; all of which are incorporated by reference herein in their entireties.

Because the exposed peripheral ledge 46 of the baseplate 42 is not covered by the dielectric 30, the relatively strong ledge can be detachably connected to the pedestal flange 40 to allow for easy removal of the electrostatic chuck 24 comprising the puck 27 and baseplate 42 from the pedestal 26 in a chamber. This connection can be achieved by inserting connectors 44 through the composite material of the ledge 46 and into the flange 40 of the pedestal 26. The detachable electrostatic chuck 24 can be removed from the pedestal 26 by removing the connectors 44 when the puck 27 or baseplate 42 becomes excessively eroded or dirty with process residues. The "detachable" electrostatic chuck 24 reduces the costs associated with processing substrates with the electrostatic chuck 24 by allowing the electrostatic puck 27 and/or baseplate 42 to be replaced or refurbished as needed, without requiring replacement of the entire electrostatic chuck 24.

To connect the baseplate 42 to the pedestal 26, the peripheral ledge 46 comprises a plurality of holes 50 that are sized and shaped to allow connectors 44 to pass therethrough to connect to the pedestal flange 40 (FIG. 1). For example, the holes 50 may extend vertically through a thickness of the peripheral ledge 46, from an upper surface 59 to a lower surface 60. The holes 50 can also extend through at least a portion of the pedestal flange 40 to secure the ledge 46 to the flange 40. A connector 44 suitable to connect the baseplate ledge 46 to the pedestal flange 40 via the holes 50 can comprise, for example, at least one of a pin, bracket, bolt or screw.

For example, the connector 44 may comprise a threaded pin having a head 62 that is held on the top surface 59 of the peripheral ledge 46, and a threaded lower end 63 that fits into the threaded hole 50 to secure the baseplate 42 to the pedestal 26. The baseplate 42 desirably comprises a material that is sufficiently strong to allow it to be easily machined to shape and which can be secured to the pedestal 26 via the holes 50 substantially without cracking or breaking.

A substrate processing apparatus 100 comprises a chamber 102 with a substrate support 20 comprising an electrostatic chuck 24 detachably mounted on a pedestal 26, as shown in FIG. 5. The pedestal 26 comprises a housing 80 adapted to protect portions of the electrostatic chuck 24 from the process environment. The housing 80 protects components within the enclosure, such as for example electrical connectors, gas tubes and fluid conduits. The pedestal 26 further comprises a pedestal flange 40 that extends outwardly from the top of the housing 80 to provide a projecting support for the electrostatic chuck 24. The pedestal housing 80 can comprise a metal that is resistant to corrosion in the substrate processing environment, such as for example, stainless steel or titanium. The pedestal 26 can also comprise a pedestal column that extends between the housing 80 and the chamber 102. In the version shown, the pedestal column comprises a bellows 84 and a motorized moveable post 82. The pedestal housing 80 is mounted to the moveable post 82 and a motor (not shown) is used to raise and lower the moveable post 82 and thereby the substrate support 20 within the process chamber 102. In one version, the bellows 84 comprises an edge-welded stainless steel bellows. The upper edge of the bellows 84 is welded to the pedestal housing 80 and the lower edge of the bellows 84 is fastened to the bottom wall 110 of the chamber. An O-ring is mounted at the interface between the bottom wall 110 and the bellows 84. Electrical connectors, gas conduits and fluid conduits can be passed through the bellows 84 to protect them from the processing environment.

The electrostatic chuck 24 can further comprise other elements that improve substrate processing, such as for example, a thermocouple 33 having a temperature sensing end embedded in the electrostatic puck 27, as shown in FIG. 2. The thermocouple 33 can connect to a temperature monitor, such as a chamber controller 200, to monitor the temperature of the electrostatic chuck 24 and substrate 22 during processing. The electrostatic chuck 24 can also comprise a heat transfer gas port 38 on the receiving surface 34 of the electrostatic puck 27 to deliver a heat transfer gas, such as argon, to the backside of a substrate 22. The heat transfer gas port 38 can feed channels formed on the support receiving surface 34, and can be connected via a gas tube 72 to a heat transfer gas supply (not shown). A gas coupler 74 can be inserted into electrostatic puck 27 to define a path for the heat transfer gas through the puck 27, and to provide a desired flow of the heat transfer gas to the support receiving surface 34.

In one version, the pedestal 26 further comprises a heat transfer plate 56 which contacts the backside surface 47 of the chuck 24 to transfer heat to or from the chuck 24 and overlying substrate 22 to maintain a desired substrate temperature. For example, the heat transfer plate 56 may comprise a heating or cooling plate. In one version, the heat transfer plate 56 can comprise at least one fluid channel 58 through which a heat transfer fluid can be flowed to control the temperature of the heat transfer plate 56. The heat transfer fluid is supplied by a fluid supply 57 connected to the fluid channel 58 via one or more conduits 61 routed through the column 51 of the pedestal 26. The heat transfer plate 56 desirably extends beneath a substantial portion of the substrate receiving surface 34, such as for example from at least about 25% to about 85% of the substrate receiving surface 34, to provide good heat exchange with the substrate 22. The heat transfer plate 56 is made of a thermally conductive material such as a metal, for example at least one of copper, stainless steel or aluminum. A thermal conductor 86 can be provided between the baseplate 42 and the heat transfer plate 56 to enhance heat exchange therebetween. The thermal conductor 86 conforms to the top surface 65 of the heat transfer plate 56 and the bottom surface 47 of the baseplate 42. In one version, the thermal conductor 86 comprises an interstitial material layer such as graphite. In one version, the heat transfer plate 56 is mounted to the pedestal 26 via a spring 83, which presses the heat transfer plate 56 to the bottom surface 47 of the baseplate 42, thereby ensuring thermal contact.

An embodiment of an apparatus 100 comprising a substrate-processing chamber 102 suitable for processing a substrate 22 is shown in FIG. 5. The particular embodiment of the apparatus 100 shown herein is suitable for processing a substrate 22, such as semiconductor wafers, and may be adapted by those of ordinary skill to process other substrates 22, such as flat panel displays, polymer panels, or other electrical circuit receiving structures. The apparatus 100 is particularly useful for processing layers, such as etch resistant, silicon-containing, metal-containing, dielectric, and/or conductor layers on the substrate 22. The apparatus 100 may also be attached to a platform (not shown) that contains and provides electrical, plumbing, and other support functions for the apparatus 100 and may be part of a multi-chamber system (also not shown).

Generally, the process chamber 102 comprises enclosure walls 104, which may comprise a ceiling 106, sidewalls 108, and a bottom wall 110 that enclose a process zone 112. In operation, process gas is introduced into the chamber 102 through a gas supply 120 that includes a process gas source 122, and a gas distributor 124. The gas distributor 124 may comprise one or more conduits 126 having one or more gas flow valves 128 and one or more gas outlets 130 around a periphery of the substrate 22, which is held in the process zone 112 on the electrostatic chuck 24. Alternatively, the gas distributor 124 may comprise a showerhead gas distributor (not shown). Spent process gas and process byproducts are exhausted from the chamber 102 through an exhaust 140 which may include an exhaust port 144 that receives spent process gas from the process zone 112 and delivers the gas to an exhaust conduit 146, a throttle valve 148 to control the pressure of process gas in the chamber 102, and one or more exhaust pumps 150.

The process gas may be energized to process the substrate 22 by a gas energize r 154 that couples energy to the process gas in the process zone 112 of the chamber 102. For example, the gas energizer 154 may comprise process electrodes that may be electrically biased to energize the process gas. The process electrodes may include an electrode that is a wall 104, such as a sidewall 108 of the chamber 102, and which may be capacitively coupled to another electrode, such as the ceiling 106 or target 170 in the chamber 102. The target 170 is electrically biased relative to the wall 104 to energize a process gas in the chamber 102 to sputter material off from the target 170 onto the substrate 22. The electrodes are biased by a DC voltage, a high frequency voltage, such as a radio frequency (RF) voltage, or a combination of both.

Alternatively or additionally, the gas energizer 154 can also include an antenna comprising an inductor coil 164 which has a circular symmetry about the center of the chamber 102. The inductor coil 164 is supported by stand-offs 166 that separate the coil from the chamber sidewall 108. In yet another version, the gas energizer 154 may comprise a microwave source and waveguide to activate the process gas by microwave energy in a remote zone (not shown) upstream from the chamber 102. Additional inductor or electromagnetic coils (not shown) can also be located around the chamber 102, for example, above the ceiling of the chamber or around the sidewalls 108.

In one version, the chamber 102 comprises a physical vapor deposition chamber capable of sputter depositing material on a substrate 22. In this version, the chamber comprises a ceiling 106 which has a sputtering target 170 having material to be deposited on the substrate. The target 170 can be electrically biased with respect to another component in the chamber, such as a process shield, by the gas energizer 154 that energizes the process gas and sputters material from the target 170 and onto the substrate 22. When a target 170 is used, the chamber also comprises an L-shaped shield 174 surrounding the periphery of the substrate 22 to capture process deposits. In addition a deposition ring 176 and cover ring 178 can also be used to protect the edge of the chuck 24 and the pedestal flange 40.

To process a substrate 22, the process chamber 102 is evacuated and maintained at a predetermined sub-atmospheric pressure. A substrate 22 is then provided on the electrostatic chuck 24 of the substrate support 20 by a substrate transport 180 which operates a robot arm 184 that is passed through a slit 186 in the chamber sidewall 108, bearing a substrate 22. A lift pin system 190 comprising lift pins 45, are raised through the holes 41 in the support 20 to receive the substrate 22. The lift pins lower through the same holes 41 to rest the substrate 22 on the substrate support receiving surface 34. The gas distributor 124 provides a process gas to the chamber 102 and the gas energizer 154 couples energy to the process gas to energize the gas and process the substrate 22, for example, by etching material on the substrate or depositing material on the substrate 22 by PVD or CVD. If required, to clean the chamber after processing of the substrate 22, the gas distributor 124 provides a process gas comprising a cleaning gas to the chamber 102 and the gas energizer 154 energizes the cleaning gas.

The chamber 102 is controlled by a controller 200 that comprises program code having instruction sets to operate components of the chamber 102 to process substrates 22 in the chamber 102. For example, the controller 200 can comprise a substrate positioning instruction set to operate one or more of the electrostatic chuck 24, lift pins 45, and substrate transport 180 to position a substrate 22 in the chamber 102 and to set a chucking voltage applied by the electrode power supply 160 to hold the substrate 22 on the electrostatic chuck 24; a gas flow control instruction set to operate the flow control valves 134 to set a flow of gas to the chamber 102; a gas pressure control instruction set to operate the exhaust throttle valve 148 to maintain a pressure in the chamber 102; a gas energizer control instruction set to operate the gas energizer 154 to set a gas energizing power level; a temperature control instruction set to control temperatures in the chamber 102, for example by controlling the supply of heat transfer fluid supplied to the heat transfer plate 56, and the supply of heat transfer gas to the support receiving surface 34; and a process monitoring instruction set to monitor the process in the chamber 102, for example by monitoring temperatures via the thermocouple 33.

Although exemplary embodiments of the present invention are shown and described, those of ordinary skill in the art may devise other embodiments which incorporate the present invention, and which are also within the scope of the present invention. For example, the electrostatic chuck 24 can be of other types, for example, a polymer dielectric layer covering a metal plate that serves as an electrode. Moreover, the chuck 24 can be attached to the pedestal by other means than the peripheral ledge 46 and pedestal flange 40, for example, a screwing thread on the backside of the chuck. Furthermore, relative or positional terms shown with respect to the exemplary embodiments are interchangeable. Therefore, the appended claims should not be limited to the descriptions of the preferred versions, materials, or spatial arrangements described herein to illustrate the invention.

What is claimed is:

1. A detachable electrostatic chuck for attachment to a pedestal in a process chamber, the detachable electrostatic chuck comprising:
   (a) an electrostatic puck comprising a ceramic body having an embedded electrode, a substrate receiving surface, and an annular flange;
   (b) a baseplate below the electrostatic puck, the baseplate having a peripheral ledge extending beyond the annular flange of the ceramic body, and a bottom surface; and
   (c) a sealing assembly comprising a sealing plate and a concentric sealing ring, the sealing assembly being bonded to the bottom surface of the baseplate.

2. A chuck according to claim 1 wherein the sealing ring is a circular ring.

3. A chuck according to claim 2 wherein the circular ring comprises an inner radius of at least about 10 cm and an outer radius of less than about 18 cm.

4. A chuck according to claim 1 wherein the sealing plate is D-shaped.

5. A chuck according to claim 4 wherein the D-shape comprises a flat edge connected to a semicircular perimeter.

6. A chuck according to claim 5 wherein the electrostatic chuck rests on a pedestal, and wherein the flat edge of the D-shape of the sealing plate serves as an alignment key that mates with a corresponding flat edged cavity in the pedestal.

7. A chuck according to claim 4 wherein the D-shaped sealing plate comprises five apertures shaped and positioned to allow passage of one or more gas couplers, thermocouples, and electrode posts.

8. A chuck according to claim 1 wherein the sealing plate and sealing ring each have a thickness of less than about 4 mm.

9. A chuck according to claim 1 wherein the sealing plate and sealing ring each comprise a surface flatness of less than about 200 microns.

10. A chuck according to claim 1 wherein the sealing plate and sealing ring each comprise a surface flatness of from about 25 to about 125 microns.

11. A chuck according to claim 1 wherein the sealing plate and sealing ring each comprise a roughness average (RA) of less than 63.

12. A chuck according to claim 1 wherein the sealing plate and sealing ring each comprise a roughness average (RA) of less than 32.

13. A chuck according to claim 10 wherein the sealing plate and sealing ring comprise (i) aluminum nitride, or (ii) nickel, molybdenum, stainless steel, titanium, zirconium, or alloys thereof.

14. A chuck according to claim 1 wherein the sealing plate and sealing ring comprise molybdenum.

15. A chuck according to claim 1 wherein the ceramic body of the electrostatic puck comprises aluminum nitride with an embedded electrode of molybdenum; and the baseplate comprises silicon carbide infiltrated with a metal alloy comprising aluminum.

16. A substrate support comprising:
   (a) the electrostatic chuck of claim 1;
   (b) a pedestal having an upper surface, a housing, and an outwardly extending pedestal flange capable of being attached to the peripheral ledge of the baseplate of the electrostatic chuck; and
   (c) a set of O-rings between the sealing assembly and the upper surface of the pedestal.

17. A substrate processing chamber comprising the substrate support of claim 16, and further comprising a gas supply to provide a process gas in the chamber, a gas energizer to energize the gas, and an exhaust port to exhaust the gas from the chamber.

18. A method of fabricating an electrostatic chuck, the method comprising the steps of:
   (a) forming an electrostatic puck comprising a ceramic body with an embedded electrode, the ceramic body having a substrate receiving surface, a bottom surface, and an annular flange;
   (b) forming a baseplate comprising a porous ceramic having a peripheral ledge, top surface, and bottom surface;
   (c) forming a sealing assembly comprising a sealing plate and a sealing ring;
   (d) holding (i) the top surface of the baseplate against the bottom surface of the electrostatic puck so that the peripheral ledge of the baseplate extends beyond the annular flange of the ceramic body of the electrostatic puck, and (ii) the sealing assembly positioned against the bottom surface of the baseplate;
   (e) infiltrating molten metal into the porous ceramic of the baseplate and between the gaps of the ceramic body, baseplate, and sealing assembly, to:
      (i) bond the ceramic body to the baseplate with a metal bond;
      (ii) infiltrate the porous ceramic of the baseplate with the metal; and
      (iii) bond the sealing assembly to the to the bottom surface of the baseplate.

19. A method according to claim 18 comprising polishing an exposed surface of the sealing assembly to a surface flatness of less than about 200 microns.

20. A method according to claim 18 comprising polishing an exposed surface of the sealing assembly to a roughness average (RA) of less than about 32.

21. A method according to claim 18 comprising forming the sealing assembly from a metal sheet having a thickness of less than about 4 mm.

22. A method according to claim 18 comprising forming the sealing assembly from molybdenum.

23. A method according to claim 18 comprising forming the sealing ring by stamping a circular ring from a metal sheet.

24. A method according to claim 18 comprising forming the sealing plate by stamping a D-shape from a metal sheet.

25. A method according to claim 23 comprising forming the D-shaped plate to have a flat edge connected to a semicircular perimeter such that the flat edge serves as an alignment key that mates with a corresponding flat edged cavity in a pedestal.

26. A sealing assembly for forming a gas tight seal between an electrostatic chuck and a pedestal in a process chamber, the sealing ring comprising:
   (a) a sealing plate that is D-shaped with a flat edge connected to a semicircular perimeter; and
   (b) a sealing ring comprising a circular ring which is concentric to the sealing plate,
   wherein the sealing plate and sealing ring each comprise a surface flatness of less than about 200 microns.

27. An assembly according to claim 26 wherein the circular ring of the sealing ring comprises an inner radius of at least about 10 cm and an outer radius of less than about 18 cm.

28. An assembly according to claim 26 wherein the flat edge of the D-shaped sealing plate serves as an alignment key that mates with a corresponding flat edged cavity in the pedestal.

29. An assembly according to claim 26 wherein the sealing plate and sealing ring each have a thickness of less than about 4 mm.

30. An assembly according to claim 26 wherein the sealing plate and sealing ring comprise molybdenum.

31. A chuck according to claim 1 wherein the baseplate comprises a backside surface having a raised central protrusion.

32. A chuck according to claim 31 wherein the raised central protrusion is surrounded by an annular trough.

33. A chuck according to claim 32 wherein the raised central protrusion is D-shaped.

34. A chuck according to claim 1 wherein the baseplate comprises metal.

35. A chuck according to claim 34 wherein the metal comprises aluminum.

36. A chuck according to claim 35 wherein the metal comprises aluminum and silicon.

37. A detachable electrostatic chuck for attachment to a pedestal in a process chamber, the detachable electrostatic chuck comprising: (a) an electrostatic puck comprising a ceramic body having an embedded electrode, a substrate receiving surface, and an annular flange; (b) a baseplate below the electrostatic puck, the baseplate having a peripheral ledge extending beyond the annular flange of the ceramic body, and a bottom surface, the baseplate comprising aluminum; and (c) a sealing assembly comprising a sealing plate and a concentric sealing ring, the sealing assembly being bonded to the bottom surface of the baseplate.

38. A chuck according to claim 37 wherein the baseplate comprises

* * * * *